United States Patent
Maebashi et al.

(10) Patent No.: US 8,038,833 B2
(45) Date of Patent: Oct. 18, 2011

(54) PLASMA PROCESSING APPARATUS

(75) Inventors: Satoshi Maebashi, Nirasaki (JP);
Toshihiro Hayami, Nirasaki (JP);
Naoyuki Umehara, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 104 days.

(21) Appl. No.: 12/506,838

(22) Filed: Jul. 21, 2009

(65) Prior Publication Data

US 2009/0277585 A1    Nov. 12, 2009

Related U.S. Application Data

(63) Continuation of application No. 10/933,422, filed on Sep. 3, 2004, now abandoned.

(30) Foreign Application Priority Data

| Sep. 3, 2003 | (JP) | 2003-311144 |
| Sep. 25, 2003 | (JP) | 2003-333758 |
| Aug. 6, 2004 | (JP) | 2004-231445 |

(51) Int. Cl.
*H01L 21/00* (2006.01)
*C23C 14/00* (2006.01)
*C23C 16/00* (2006.01)

(52) U.S. Cl. ......... 156/345.28; 156/345.24; 156/345.43; 156/345.44; 156/345.47; 118/723 R

(58) Field of Classification Search .......... None
See application file for complete search history.

(56) References Cited

U.S. PATENT DOCUMENTS

| 4,205,267 A | * | 5/1980 | Williams | 324/458 |
| 5,473,244 A | * | 12/1995 | Libove et al. | 324/126 |
| 5,665,166 A | * | 9/1997 | Deguchi et al. | 118/723 E |
| 6,037,797 A | | 3/2000 | Lagowski et al. | |
| 6,043,641 A | * | 3/2000 | Singer et al. | 324/127 |
| 6,074,518 A | * | 6/2000 | Imafuku et al. | 156/345.46 |
| 6,110,287 A | | 8/2000 | Arai et al. | |

(Continued)

FOREIGN PATENT DOCUMENTS

JP    1-301871 A    12/1989

(Continued)

OTHER PUBLICATIONS

Japanese Office Action dated Jun. 8, 2010 and an English Translation thereof.

*Primary Examiner* — Ram N. Kackar

(74) *Attorney, Agent, or Firm* — Oblon, Spivak, McClelland, Maier & Neustadt, L.L.P.

(57) ABSTRACT

In a plasma processing apparatus, a member for propagating high frequency from a high frequency power supply and/or to which the high frequency is applied. A power feed rod is electromagnetically shielded between a matching unit and a bottom plate of a chamber by a coaxial cylindrical conductor connected to a ground potential. A surface potential system disposed in an appropriate distance from the power feed rod in radius direction is installed in the cylindrical conductor, and measures in a non-contact state the electrostatic surface potential of the power feed rod through electrostatic capacitance and provides a controller with a surface potential detection signal including surface potential measurement value information. The controller performs a required signal processing or operation processing on the basis of the surface potential detection signal from the surface potential system, thereby obtaining the measurement value of the DC potential on the power feed rod.

5 Claims, 14 Drawing Sheets

U.S. PATENT DOCUMENTS

| | | | |
|---|---|---|---|
| 6,470,283 B1 * | 10/2002 | Edel | 702/64 |
| 2001/0025691 A1 * | 10/2001 | Kanno et al. | 156/345 |
| 2002/0093648 A1 * | 7/2002 | Nikoonahad et al. | 356/237.1 |
| 2004/0057497 A1 | 3/2004 | Lagowski et al. | |

FOREIGN PATENT DOCUMENTS

| | | |
|---|---|---|
| JP | 11-8095 | 1/1999 |
| JP | 2002-164685 | 6/2002 |
| WO | WO 98/33362 | 7/1998 |

* cited by examiner

PLASMA PROCESSING APPARATUS

CROSS REFERENCES

This application is a Continuation of and claims the benefit of priority under 35 U.S.C. §120 from U.S. Ser. No. 10/933,422, the entire contents of which are incorporated herein by reference, filed Sep. 3, 2004 and claims the benefit of priority under 35 U.S.C. §119 from Japanese Patent Application Nos. 2003-311144 filed Sep. 3, 2003; 2003-333758 filed Sep. 25, 2003; and 2004-231445 filed Aug. 6, 2004.

FIELD OF THE INVENTION

The present invention relates to a plasma processing apparatus; and, more particularly, to a method and an apparatus for measuring a DC potential of a member propagating or receiving a high frequency from a high frequency power supply.

BACKGROUND OF THE INVENTION

Generally, in a parallel plate type plasma processing apparatus, a negative DC potential $V_{dc}$ is generated in an electrode or a high frequency electrode to which a high frequency (RF) for generating a plasma is applied. From this, in a parallel plate type plasma etching apparatus, a high frequency is conventionally applied to a lower electrode or a susceptor on which a substrate to be processed is mounted, in order for ions in a plasma to be vertically drawn onto a surface of the substrate with the force of an electric field by a negative DC potential $V_{dc}$ on the surface of the susceptor, thereby performing anisotropic etching or reactive ion etching (RIE). Further, such a DC potential $V_{dc}$ on the high frequency electrode has a correlation with an etching condition, a high frequency discharge state in a processing vessel or the like. For example, if a gas pressure in the processing vessel is lowered, the absolute value of the DC potential $V_{dc}$ becomes higher. Moreover, if an extraordinary condition occurs in a high frequency discharge system by, e.g., deterioration as a result of the elapse of time, it is reflected in the DC potential $V_{dc}$ (generally, the absolute value of $V_{dc}$ is increased). Thus, the DC potential $V_{dc}$ has been measured to represent a process parameter indicating a variation of plasma processing conditions or a maintenance parameter indicating a repair or replacement timing of a high frequency component or a member.

Conventionally, a voltage sense line is connected to a high frequency electrode or a power feed rod directly coupled therewith, and a DC potential $V_{dc}$ detected by the voltage sense line is entered as an analog DC voltage to a voltage measurement circuit, thereby obtaining a measurement value of the DC potential $V_{dc}$.

In a latest plasma processing apparatus, the power of a high frequency used tends to be increased in order to enhance the efficiency or miniaturization of a plasma processing; and accordingly, a peak-to-peak value of a high frequency voltage being propagated through the power feed rod or the high frequency electrode is increased. For this reason, in a conventional measurement method for introducing a DC potential $V_{dc}$ into a voltage measurement circuit by putting a voltage sense line in contact with the high frequency electrode or the power feed rod, a high frequency that originally has to be supplied to a high frequency electrode runs off to the ground from a place in which a voltage measurement unit is installed (being leaked or discharged) through a measurement circuit in the unit or a unit housing. Therefore, the measurement unit itself may be damaged or cause to be damaged, and there are problems that could have negative impact on a high frequency discharge in a processing vessel and a characteristic of a plasma generation and, further, a plasma processing quality.

SUMMARY OF THE INVENTION

The present invention was conceived taking into consideration the problems of the conventional technology. It is, therefore, an object of the present invention to provide a DC potential measuring method, a DC potential measuring apparatus and a plasma processing apparatus capable of safely and accurately measuring a DC potential of a member propagating or receiving a high frequency from a high frequency power supply.

In order to achieve the object described above, in accordance with the present invention, there is a DC voltage measuring method, for use with a plasma processing apparatus in which a high frequency voltage from a high frequency power supply is applied to a high frequency electrode provided in a processing vessel through a high frequency feeding conductor, for measuring a DC potential of the high frequency electrode or the high frequency feeding conductor, wherein a measurement value of the DC potential is obtained by non-contactly measuring an electrostatic surface potential of the high frequency electrode or the high frequency feeding conductor by using electrostatic capacitance.

Further, in accordance with the present invention, there is provided a DC voltage measuring apparatus, for use with a plasma processing apparatus in which a high frequency voltage from a high frequency power supply is applied to a high frequency electrode provided in a processing vessel through a high frequency feeding conductor, for measuring a DC potential of the high frequency electrode or the high frequency feeding conductor, the DC voltage measuring apparatus including: a unit for obtaining a measurement value of the DC potential by non-contactly measuring an electrostatic surface potential of the high frequency electrode or the high frequency feeding conductor by using electrostatic capacitance.

Further, in accordance with the present invention, there is provided a plasma processing apparatus including: a processing vessel for providing a depressurized space for performing a plasma processing on a substrate to be processed; a first electrode disposed in the processing vessel; a processing gas supply unit for supplying a processing gas into the processing vessel; a high frequency power supply for generating a high frequency voltage for forming a plasma; a high frequency feeding conductor connected to the first electrode for supplying the high frequency voltage from the high frequency power supply to the first electrode; and a DC potential measurement unit for non-contactly measuring an electrostatic surface potential of the first electrode or the high frequency feeding conductor by using electrostatic capacitance to obtain the DC potential.

In the present invention, a surface potential on a power feed rod through which a high frequency voltage from a high frequency power supply is propagated or an electrode (a high frequency electrode) to which the corresponding high frequency voltage is applied, is measured in a non-contact state through an electrostatic capacitance without passing through a conductor, thereby obtaining a measurement value of a DC potential from a signal indicating a measurement value of the surface potential. Because such a non-contact method is employed, even in case a high frequency power is increased greatly, the problem of causing a leakage or a discharge of a high frequency in a measurement point does not exist while the measurement value of the DC potential can be obtained safely and accurately without affecting the high frequency discharge or plasma generation.

A typical example in accordance with the plasma processing apparatus of the present invention has a configuration of disposing a second electrode facing the first electrode in parallel in the processing vessel. In such a parallel plate type apparatus, as a typical example, a substrate to be processed is disposed on the first electrode and vent-holes for discharging a processing gas toward the first electrode are provided in the second electrode.

Further, in case a matching unit for performing an impedance matching between a high frequency power supply side and a load side—is provided, a high frequency feeding conductor may be connected to an output terminal of the matching unit. In this case, preferably the matching unit may be installed in the outside of the processing vessel, and a cylindrical conductor between the matching unit and the processing vessel connected to a ground potential may be configured to surround the high frequency feeding conductor.

Furthermore, the high frequency feeding conductor may be preferably configured to include a first bar-type conductor whose one end is fixed to a rear surface of the first electrode; a second bar-type conductor whose one end is fixed to the output terminal of the matching unit; and a first connecting part for attachably and detachably connecting the other ends of the first and the second bar-type conductor with each other. The cylindrical conductor may also be preferably configured to include a first cylindrical conductor portion whose one end is coupled to the processing vessel; a second cylindrical conductor portion whose one end is coupled to the matching unit; and a second connecting part for attachably and detachably connecting the other ends of the first and the second cylindrical conductor portion with each other at a position corresponding to the first connecting part, wherein a probe of a DC potential measurement portion is attachably and detachably installed in the second connecting part. As configured above, the probe of the DC potential measurement portion is installed in the second connecting part detachably disposed adjacent to the high frequency feeding conductor, so that the measurement portion is simply adjusted and maintained, and this configuration is easily employed in a conventional processing apparatus.

In accordance with the present invention, by the configurations and operations as described above, the DC potential of the member for propagating or receiving a high frequency from the high frequency power supply can be measured safely and accurately in the plasma processing apparatus.

DETAILED DESCRIPTION OF THE PREFERRED EMBODIMENT

Preferred embodiments of the present invention will now be described with reference to the accompanying drawings.

Figure 1:
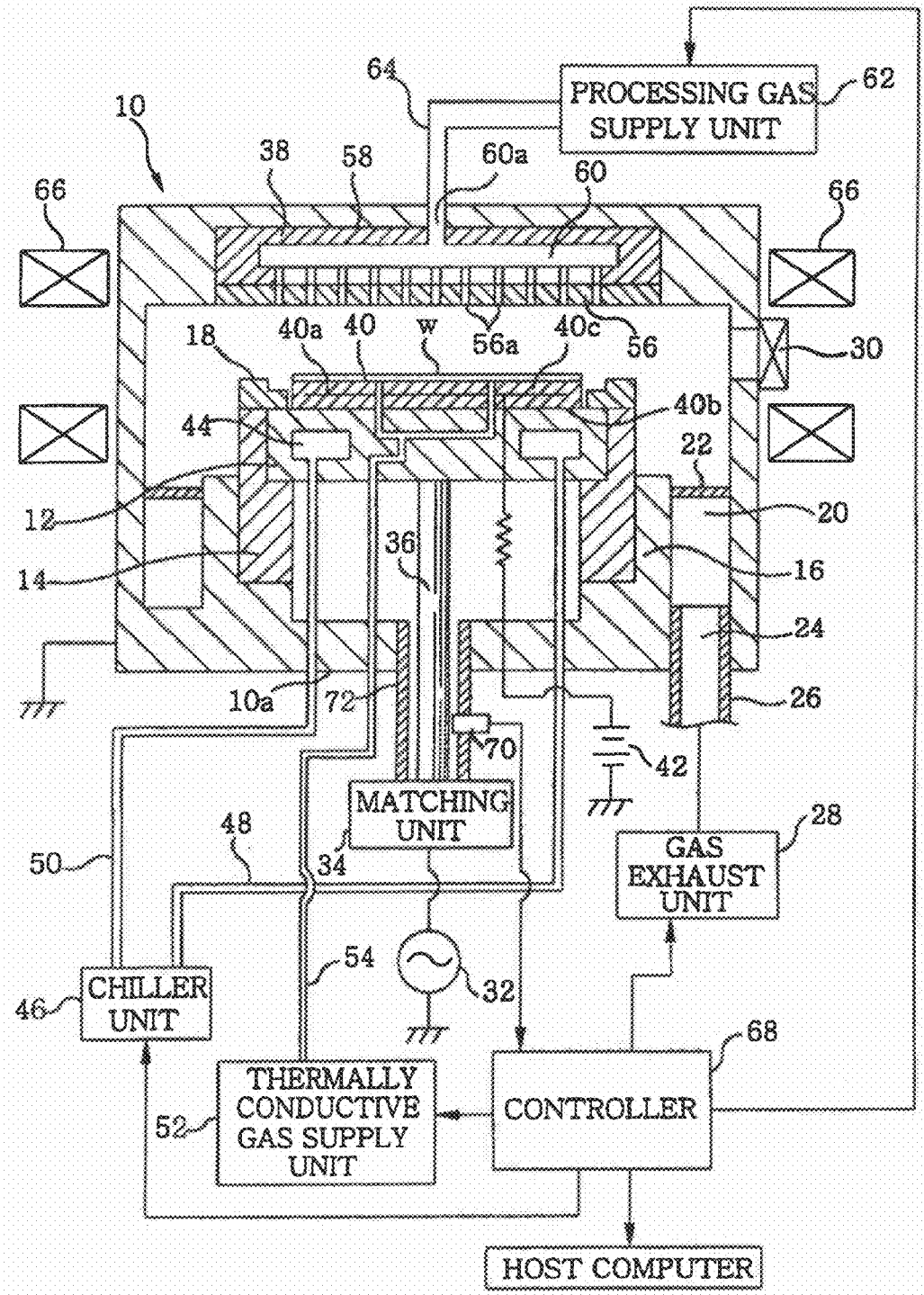
FIG. 1 provides a longitudinal sectional view showing a configuration of a plasma processing apparatus in accordance with a first preferred embodiment of the present invention.

FIG. 1 shows a configuration of a plasma processing apparatus in accordance with a first preferred embodiment of the present invention. The plasma processing apparatus is configured as an RIE type plasma etching apparatus and has a cylindrical chamber (a processing vessel) 10 made of a metal such as aluminum, stainless steel or the like. The chamber 10 is frame grounded.

Installed in the chamber 10 is a disk-shaped lower electrode or susceptor 12 for mounting thereon, e.g., a semiconductor wafer W as a substrate to be processed. The susceptor 12 made of, e.g., aluminum is supported by a cylindrical supporting portion 16 extended vertically upward from the bottom of the chamber 10 through an insulating cylindrical maintaining portion 14. Disposed on the top surface of the cylindrical maintaining portion 14 is a focus ring 18 made of, e.g., quartz, surrounding annularly the top surface of the susceptor 12.

Formed between a sidewall of the chamber 10 and the cylindrical supporting portion 16 is an annular gas exhaust line 20, and disposed in the entrance or the middle of the gas exhaust line 20 is an annular baffle plate 22 while a gas exhaust port 24 is disposed in the bottom portion thereof. Coupled to the gas exhaust port 24 is a gas exhaust unit 28 via a gas exhaust pipe 26. The gas exhaust unit 28 having a vacuum pump can depressurize a processing space in the chamber 10 to a predetermined vacuum level. Installed in the sidewall of the chamber 10 is a gate valve 30 for opening/closing a loading/unloading port of the semiconductor wafer W.

Electrically coupled to the susceptor 12 is a high frequency power supply 32 for generating a plasma and an RIE via a matching unit 34 and a power feed rod 36. The high frequency power supply 32 supplies a high frequency voltage of a predetermined high frequency, e.g., 60 MHz to the lower electrode, that is, the susceptor 12. Installed in a ceiling portion of the chamber 10 is a shower head 38 to be described later as an upper electrode of a ground potential. Accordingly, the high frequency voltage from the high frequency power supply 32 is applied between the susceptor 12 and the shower head 38.

Disposed in the top surface of the susceptor 12 is an electrostatic chuck 40 for supporting the semiconductor wafer W by an electrostatic adsorptive force. The electrostatic chuck 40 includes an electrode 40a made of a conductive film embedded between a pair of insulating films 40b and 40c, and electrically connected to the electrode 40a is a DC power supply 42. A Coulombic force generated by a DC voltage from the DC power supply 42 can adsorb and hold the semiconductor wafer W on the chuck.

Installed in the susceptor 12 is an annular coolant passageway 44 extended in, e.g., a circumferential direction. Circulated through the coolant passageway 44 is a coolant of a predetermined temperature such as cooling water from a chiller unit 46 through lines 48 and 50. The processing temperature of the semiconductor wafer W on the electrostatic chuck 40 can be controlled by the temperature of the coolant. Further, a thermally conductive gas from a thermally conductive gas supply unit 52 such as He gas is supplied between the top surface of the electrostatic chuck 40 and the back side of the semiconductor wafer W through a gas supply line 54.

The shower head 38 on the ceiling portion includes an electrode plate 56 having a plurality of gas vent-holes 56a in the bottom surface and an electrode supporting member 58 supporting the electrode plate 56 detachably. Provided in the electrode supporting member 58 is a buffer chamber 60, and coupled to a gas inlet opening 60a of the buffer chamber 60 is a gas supply line 64 from a processing gas supply unit 62.

Disposed around the chamber 10 is a magnet 66 extended in an annular shape or a concentric shape. Formed in the gap between the shower head 38 and the susceptor 12 in the chamber 10 is an RF electric field of a vertical direction by the high frequency power supply 32. By discharging a high frequency, a high density plasma can be generated around the surface of the susceptor 12.

A controller 68 controls an operation of each unit in the plasma etching apparatus such as the gas exhaust unit 28, the high frequency power supply 32, the chiller unit 46, the thermally conductive gas supply unit 52, the processing gas supply unit 62. While performing a signal processing or an operation processing for obtaining the measurement value of the DC potential $V_{dc}$ on the basis of a surface potential measurement value (signal) from a surface potential measurement unit 70 to be described later. In addition, the controller 68 is also connected to an outer apparatus (not shown) such as a host computer.

To carry out an etching in the plasma etching apparatus, the gate valve 30 is opened first, and then the semiconductor wafer W serving as an object to be processed is loaded into the chamber 10 to be mounted on the electrostatic chuck 40. Thereafter, an etching gas (generally a gaseous mixture) from the processing gas supply unit 62 is introduced into the chamber 10 at a predetermined flow rate and flow rate ratio, and the pressure in the chamber 10 is maintained to be a set value by the gas exhaust unit 28. Moreover, the high frequency power from the high frequency power supply 32 is supplied to the susceptor 12 with a predetermined power. Further, the DC voltage from the DC power supply 42 is applied to the electrode 40a of the electrostatic chuck 40, thereby holding the semiconductor wafer W on the electrostatic chuck 40. The etching gas injected from the shower head 38 is converted to a plasma between both electrodes 12 and 38 by a high frequency discharge, and a main surface of the semiconductor wafer W is etched by radicals or ions generated by the plasma.

In the plasma etching apparatus, while the high frequency from the high frequency power supply 32 is applied to the susceptor 12, a capacitor included in the matching unit 34 operates as a blocking capacitor, thereby forming a DC component or a DC potential $V_{dc}$ in the power feed rod 36 and the susceptor 12 coupled to the output side of the matching unit 34. Such a DC potential $V_{dc}$ as a so-called self-bias voltage makes a reactive ion etching (RIE) possible and can be served as a parameter indicating a variation of etching conditions or a maintenance parameter indicating a replacement timing of a related component or a member.

Next, there will be described in detail a DC potential measurement unit in the plasma etching apparatus. As shown in FIG. 1, the matching unit 34 is disposed under the chamber 10 as a matching box. The power feed rod 36 is electromagnetically shielded between the matching unit 34 and the bottom plate 10a of the chamber 10 by a coaxial cylindrical conductor 72. The cylindrical conductor 72 is coupled to the ground potential through the chamber 10 or an earth line (not shown). Installed at the cylindrical conductor 72 is a surface potential system 70 with an appropriate gap (for example, several cm) in a radial direction from the power feed rod 36. The surface potential system 70 non-contactly measures the electrostatic surface potential of the power feed rod 36 through an electrostatic capacitance and provides the controller 68 with a surface potential detection signal including a measurement value information of the surface potential.

Figure 2:
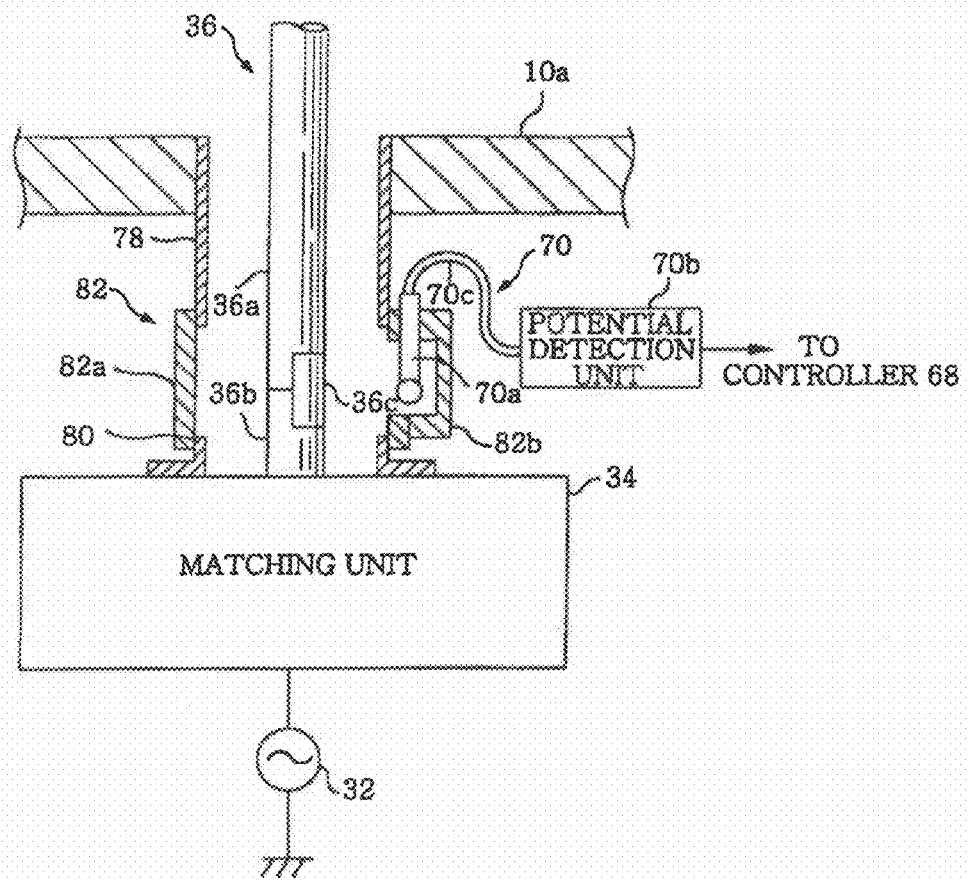
FIG. 2 is a longitudinal sectional view showing a configuration around a surface potential system in the plasma processing apparatus of the preferred embodiment.
Figure 3:
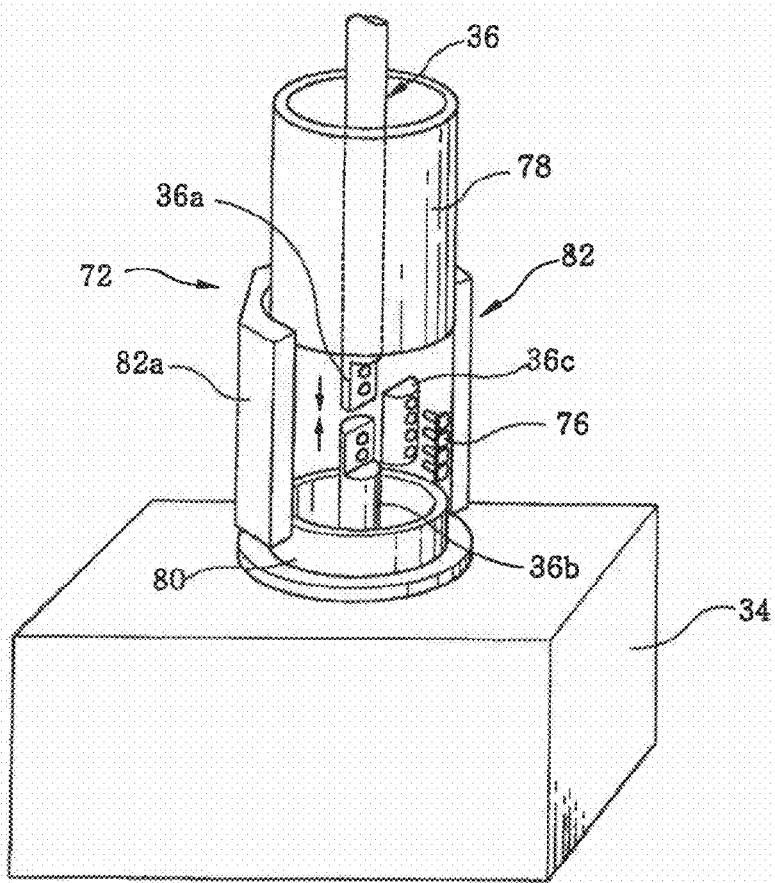
FIG. 3 describes an exploded perspective view illustrating a configuration around the surface potential system in the plasma processing apparatus.
Figure 4:
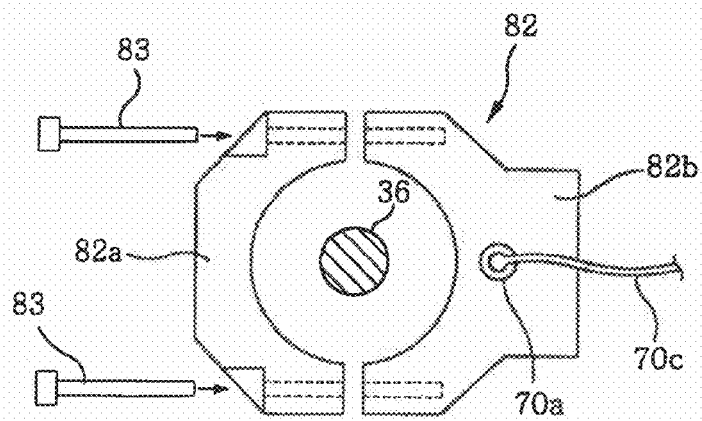
FIG. 4 sets forth a plan view showing a configuration of a cylindrical joint portion in the plasma processing apparatus.

In FIGS. 2 to 4, there is illustrated a detailed configuration around the surface potential system 70. The power feed rod 36 is composed of an upper columnar conductor 36a whose upper potion is coupled to the bottom surface or the rear surface (FIG. 1) of the susceptor 12; a lower columnar conductor 36b whose lower portion is coupled to the output terminal (not shown) of the matching unit 34; and a bar-type connecting part 36c for detachably connecting the lower end portion of the upper columnar conductor 36a with the upper end portion of the lower columnar conductor 36b. As shown in FIG. 3, one side surface of the lower end portion of the upper columnar conductor 36a and the upper end portion of the lower columnar conductor 36b is cut off to be a planar surface, and respective planar surfaces positioned to be coplanar as one surface are contacted with each other in the axial direction. Then, the bar-type connecting part 36c having a nearly semicircular cross section for supplementing the cutoff portion of both columnar conductors 36a and 36b is placed therein, thereby being linked as one unit detachably with a bolt 76 and forming the circumferential power feed rod 36.

The cylindrical conductor 72 surrounding the power feed rod 36 is made up of an upper cylindrical conductor 78 whose upper end portion is coupled to the bottom plate portion of the chamber 10; a lower cylindrical conductor 80 whose lower end portion is coupled to the housing of the matching unit 34; and a cylindrical connecting portion 82 interposed between the upper cylindrical conductor 78 and the lower cylindrical conductor 80 at a position of a height corresponding to the bar-type connecting part 36c, for connecting both detachably. The cylindrical connecting portion 82 is composed of putting a pair of semi-cylindrical connecting parts 82a and 82b on either side into contact with each other to be linked as one unit by a bolt 83 (FIG. 4) while extending the one side semi-cylindrical connecting portion 82b toward the outside of the radial direction. Disposed in a space provided in the inner side of the semi-cylindrical connecting portion 82b having a large radius is a probe 70a of the surface potential system 70.

Figure 5:
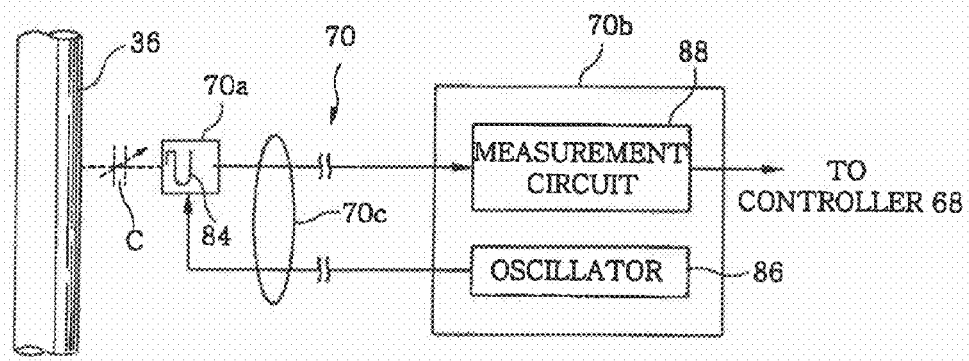
FIG. 5 is a view showing a configuration of the surface potential system in the plasma processing apparatus.

The surface potential system 70 is made up of the probe 70a installed inside the cylindrical connecting portion 82 as described above; a potential detection unit 70b disposed outside thereof; and a cable 70c electrically coupling the two of the probe 70a and the potential detection unit 70b. As shown in FIG. 5, installed in the probe 70a is a sensor electrode 84 of a tuning-fork type made of, e.g., Se. Disposed in the potential detection unit 70b are an oscillator 86 for oscillating the corresponding sensor electrode 84, a measurement circuit 88 including an amplifier for signal processing a sensor output signal from the sensor electrode 84 and so on.

An electrostatic capacitance C is generated between an object to be measured, i.e., the power feed rod 36, and the sensor electrode 84 in the probe 70a. If the sensor electrode 84 is vibrated by applying thereto an AC driving signal from the oscillator 86 in the potential detection unit 70b, the value of the electrostatic capacitance C is changed with an AC component, thereby obtaining an AC-modulated sensor output signal of the surface potential of the power feed rod 36 from the sensor electrode 84. The sensor output signal from the sensor electrode 84 is amplified and detected in the measurement circuit 88 in the potential detection unit 70b, thereby obtaining a surface potential detection signal including information such as a magnitude or a polarity of the surface potential of the power feed rod 36.

Thus, on the basis of the surface potential detection signal obtained from the surface potential system 70, the measurement value of the surface potential of the power feed rod 36 is obtained by carrying out required signal processing and operation processing at the controller 68 (FIG. 1). Generally, the measurement value of the surface potential may be the measurement value of the DC potential $V_{dc}$ and it may be amended if necessary. Further, the measurement value of the DC potential $V_{dc}$ is displayed through the host computer or the like, or it is used as a maintenance value or a parameter for monitoring, e.g., a system state. Furthermore, employed as the surface potential system 70 in accordance with the preferred embodiment may be, e.g., a surface potential system made by Trek, Inc. in the US.

As described above, in this preferred embodiment, the DC potential $V_{dc}$ on the power feed rod 36 to which the high frequency from the high frequency power supply 32 for use in a plasma generation and an RIE is propagated is measured by employing the surface potential system 70 of a non-contact manner. Therefore, the high frequency is not leaked or discharged in a measurement portion, that is, the surface potential system 70 though the high frequency power is made to be high, and the measurement value of the DC potential $V_{dc}$ can be obtained safely and accurately without affecting a high frequency discharge or a plasma generation between the lower electrode (susceptor) 12 and the upper electrode (shower head) 38.

In addition, in this preferred embodiment, a semi-cylindrical connecting portion 82b of one side of the cylindrical connecting portion 82 detachably installed in the vicinity of a joint place between the upper columnar conductor 36a at the side of the chamber 10 and the lower columnar conductor 36b at the side of the matching unit 34 is altered to install the probe 70a of the surface potential system 70 therein. Accordingly, this configuration can be easily applied to a conventional plasma etching apparatus.

Furthermore, since the DC potential $V_{dc}$ on the power feed rod 36 is nearly same or constant throughout the whole power feed rod 36, the DC potential $V_{dc}$ can be measured in any region of the power feed rod 36 by the non-contact measurement method of the preferred embodiment. Moreover, by the non-contact measurement method of the preferred embodiment, the DC potential $V_{dc}$ on the susceptor 12 also can be measured. In an actual application, since the DC potential $V_{dc}$ of the susceptor 12 is not significantly different from that of the power feed rod 36, the DC potential $V_{dc}$ on the susceptor 12 can be approximated based on the measurement value of the DC potential $V_{dc}$ obtained from the power feed rod 36.

The plasma etching apparatus in the preferred embodiment is of a type to apply the high frequency power for generating a plasma to the susceptor 12. However, though not shown, the present invention can be applied to a plasma etching apparatus of a type to apply a high frequency power for generating a plasma to the upper electrode 38 and in the case, a measurement value of a DC potential $V_{dc}$ in the upper electrode 38 or the power feed rod (not shown) directly connected thereto can be obtained safely and accurately by the same non-contact measurement method as that of the preferred embodiment.

In the following, there will be described an electrical joint member in accordance with another aspect of the present invention. Generally, a vacuum chamber and peripheral elements thereof employed in a plasma processing apparatus are configured by combining multiple members capable of being disassembled, and a good airtightness or an electrical contact between joint members are needed. In order to establish the electrical contact and joint, an effective method is such that a conductive cushion member serving as an electrical joint member is inserted between conductive members joined with each other.

In accordance with the present invention, as will be described later, there is provided an electrical joint member for effectively reducing an electrical resistance between conductive members joined with each other in a processing apparatus and further, there is no concern over metal contamination in the processing apparatus.

Figure 6:
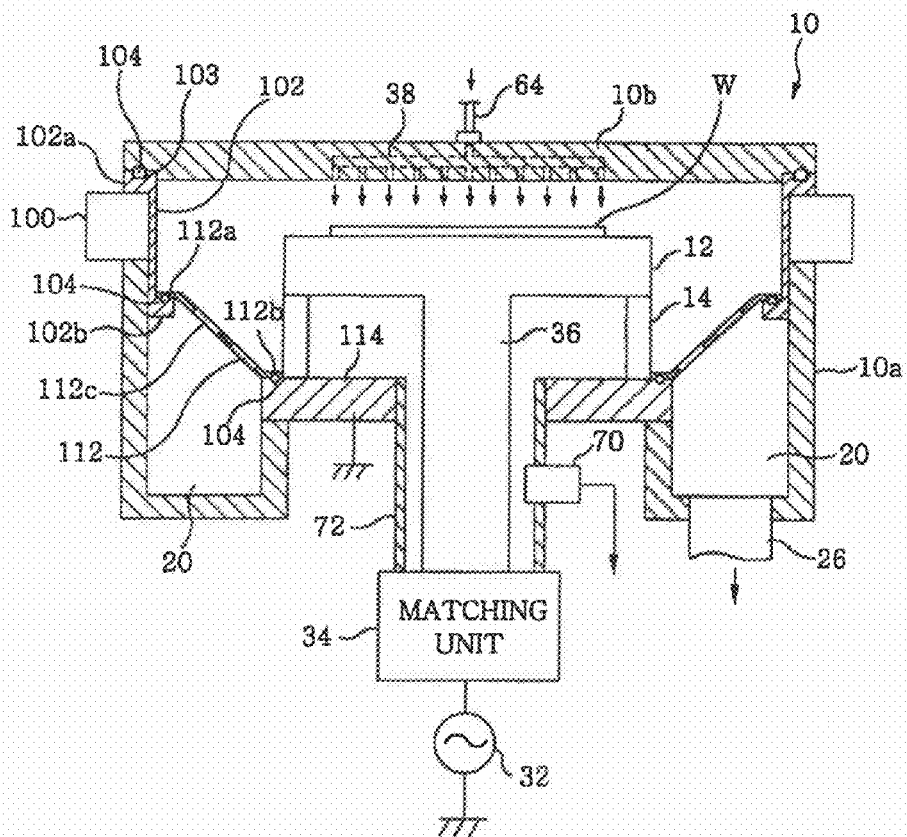
FIG. 6 is a longitudinal sectional view showing a configuration of the plasma processing apparatus in accordance with the first preferred embodiment of the present invention.

In FIG. 6, there is illustrated a configuration of the plasma etching apparatus in which the electrical joint member in accordance with the first embodiment of the present invention is employed. In the drawing, parts having the substantially same configuration or function as those of the plasma etching apparatus in FIG. 1 are assigned the identical numeral.

The chamber 10 in the plasma etching apparatus is formed by detachably linking as one unit the chamber main body member 10a whose top surface is opened and the upper chamber member 10b blocking the top surface opening of the chamber main body member 10a. Installed as one unit in the upper chamber member 10b is the shower head 38 also serving as the upper electrode.

Disposed in the sidewall of the chamber main body member 10a is a protruding port 100 having a loading/unloading port of the semiconductor wafer W at a position of a height corresponding to the gate valve (not shown), and installed in the inner side of the main body member 10a is a cylindrical deposition shield 102 coating the inner wall through, e.g., a spacer (not shown). The chamber main body member 10a, the upper chamber member 10b and the deposition shield 102 are all conductive members made of, e.g., aluminum.

The upper circumference of the deposition shield 102 is bent at a right angle to the outside of a diametrical direction, and an annular flange portion 102a, which is a peripheral region of the bent, is inserted and attached between the top surface of the chamber main body member 10a and the peripheral portion of the upper chamber member 10b. Then, inserted between the top surface of the flange portion 102a of the deposition shield 102 and the bottom surface of the peripheral portion of the upper chamber member 10b is an electrical joint member 104 in accordance with the first embodiment.

Figure 7A:
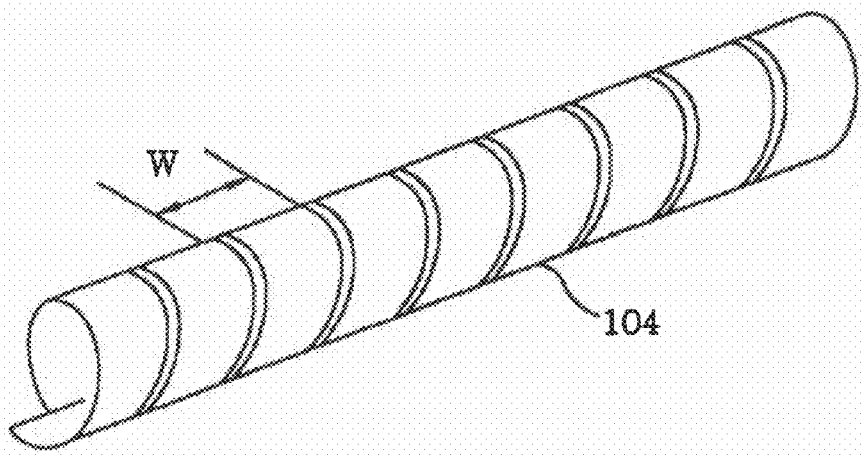
FIG. 7A is a perspective view illustrating an outline of an electrical joint member in the first preferred embodiment of the present invention.
Figure 7B:
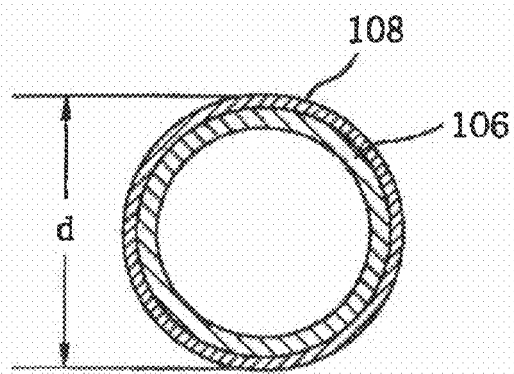
FIG. 7B is a cross sectional view showing a cross section structure of the electrical joint member.

Referring to FIGS. 7A and 7B, there are illustrated a configuration of the electrical joint member 104. The electrical joint member 104 is configured by forming a surface metal layer 108 made of aluminum, having a thickness of, e.g., 30 µm on a surface of a spiral 106 formed by using a strip-shaped body made of stainless steel, which has a thickness of, e.g., 80 µm and a width W of, e.g., 2 mm or so. As for the manufacture of the electrical joint member 104, it is possible, for example, to form the first surface metal layer 108 made of aluminum on one surface of a strip-shaped body made of stainless steel by evaporation or CVD (Chemical Vapor Deposition) and then wind in a coil shape the strip-shaped body with its surface on which the surface metal layer 108 is formed is made to be the outer surface or the exterior surface, thereby producing the electrical joint member 104 having a spiral shape and an outer diameter d of, e.g., about 2.4 mm, as shown in FIG. 7B.

In this example, the spiral 106 forms an elastic body. If stainless steel as a material of the elastic body is called a first metal material, aluminum as a material of the surface metal layer 108 is a second metal material having a lower relative resistance value than that of the first metal material and having no negative effect on manufacturing a semiconductor device.

Figure 8:
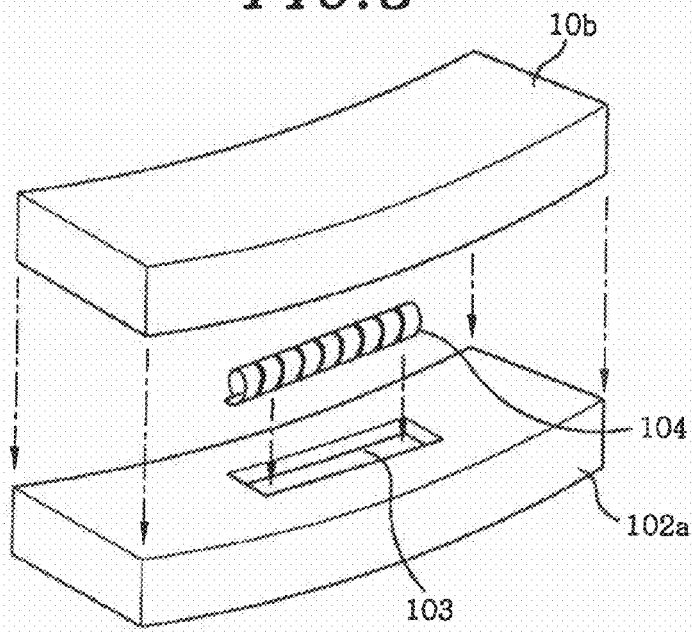
FIG. 8 is an exploded perspective view showing an example of a state of using the electrical joint member.
Figure 9:
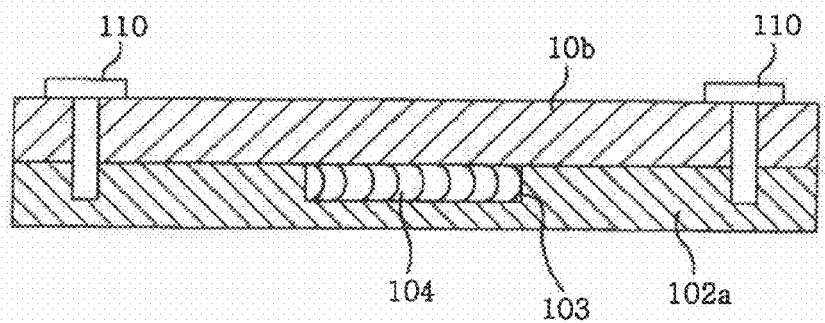
FIG. 9 is a cross sectional view showing an example of a state of using the electrical joint member.
Figure 10:
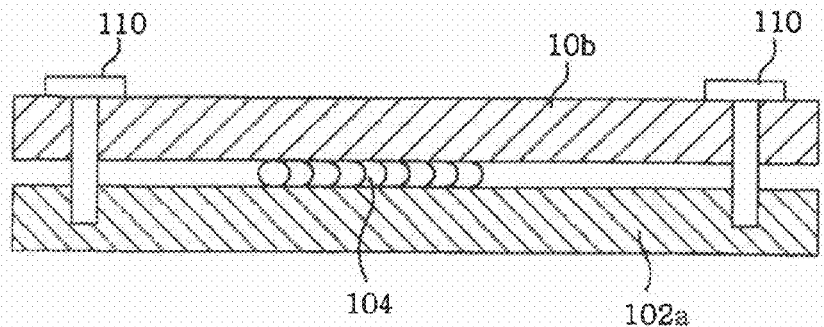
FIG. 10 is a cross sectional view showing another example of a state of using the electrical joint member.

In FIG. 6, the joint portion between the flange portion 102a of the deposition shield 102 and the upper chamber member 10b accommodates the electrical joint member 104 in a recess portion 103 provided at a side of the flange portion 102a (FIG. 8) and secures an electrical contact by pressing and fastening both by bolts 110 (FIG. 9). Though the bolts 110 are not shown in FIG. 6, the bolts 110 with the electrical joint member 104 are disposed at multiple sites at regular intervals in a circumferential direction of the chamber 10. In FIGS. 8 and 9, the depth of the groove portion 103 is set to be smaller than the outer diameter d of the electrical joint member 104. Thus, when the facing surfaces of the conductive members 10b and 102a are joined by being fastened with the bolts 110, the electrical joint member 104 gets compressed by a predetermined amount, thereby determining the contact resistances between the electrical, joint member 104 and the conductive members 10b and between the electrical joint member 104 and the conductive member 102a corresponding to the compressed value. As a modified example, for example, as shown in FIG. 10, the electrical joint member 104 may be interposed between the flat surfaces of the conductive members 10b and 102a.

In FIG. 6, the deposition shield 102 having an electric heater (not shown) has a function of improving a processing efficiency by preventing a heat loss in the processing chamber 10 and extending a maintenance cycle by preventing an adhesion of a reaction product. The lower portion of the deposition shield 102 is bent inwardly, and joined on the top surface of the bent peripheral region 102b is a bottom surface of an upper peripheral portion 112a of a flow rectifying member 112 formed in a mortar shape through the electrical joint member 104. Installed in the flow rectifying member 112 are holes 112c through which a gas flows from the side of the plasma processing space to the side of the gas exhaust line 20. The bottom surface of a lower peripheral portion 112b of the flow rectifying member 112 is joined to the top surface of a supporting ring 114 forming the bottom surface of the chamber 10 through the electrical joint member 104. The supporting ring 114 is connected to the ground potential, and joined to the inner peripheral surface thereof is the cylindrical conductor 72 surrounding the power feed rod 36. As in the plasma etching apparatus of FIG. 1, the surface potential system 70 may be installed in the cylindrical conductor 72. Further, both the flow rectifying member 112 and the supporting ring 114 are made up of conductive members made of, e.g., aluminum. The electrical joint member 104 can also be used in the joint portion between the supporting ring 114 and the cylindrical conductor 72.

Next, there will be described an operation of the plasma etching apparatus. First, by a transfer arm (not shown), the semiconductor wafer W as a substrate to be processed is loaded into the chamber 10 through the loading/unloading port in the protruding port 100 from a neighboring load-lock chamber (not shown) to be mounted on the susceptor 12. Thereafter, by closing the gate valve (not shown), the chamber 10 is made to be in an airtight state. Then, the inside of the chamber 10 is evacuated through the gas exhaust pipe 26, and a processing gas is introduced thereinto at a predetermined flow rate through the shower head 38, thereby maintaining the inside of the chamber 10 at a vacuum level of, e.g., several tens of mTorr.

Meanwhile, a high frequency having a predetermined frequency (for example, 100 MHz) from the high frequency power supply 32 is applied to the susceptor (lower electrode) 12 with a predetermined power (for example, 1500 W). Accordingly, the processing gas between the susceptor 12 and the shower head 38 forming the upper electrode is converted into a plasma, thereby performing an etching, i.e., a plasma processing on the wafer W by the plasma. Further, in addition to the high frequency for the plasma generation, a high frequency having a predetermined frequency for bias (for example, 3.2 MHz) from another high frequency power supply (not shown) may be applied to the susceptor 12 in a predetermined power (for example, 5800 W) in order to effectively induce ions in the plasma onto the semiconductor wafer W. The high frequency discharged from the susceptor 12 in the chamber 10 flows to a side of the upper chamber member 10b through the plasma and, further, flows to the earth (ground potential) through the deposition shield 102, the flow rectifying member 112 and the supporting ring 114.

In the conductive members 10b, 102, 112 and 114 which face the plasma processing space of the plasma etching apparatus on whose surfaces the high frequency flows, the contact resistance of the electrical joint member 104 inserted in the joint surface between the respective members is small, so that the electrical resistance of the joint portion can be reduced effectively, thereby making the potentials of the surface portions of the conductive members uniform.

Here, the first metal material forming the spiral 106 in the electrical joint member 104 of the present invention is not limited to stainless steel. For example, it may be titanium or a copper alloy made of, e.g., copper and beryllium (Be). Since the copper alloy has the same elasticity as that of stainless steel as known from an experimental example to be described later, it is effective as an elastic body. Further, the second metal material forming the surface metal layer 108 is not limited to aluminum. It can be any material which has a lower resistivity than that of the first metal material and has no negative effects on manufacturing a semiconductor device. For example, excepting transition metals, an alkali metals and alkaline-earth metals, any kind of metals, other than aluminum, or an alloy of such metals may be used. The metal material having the negative effects on manufacturing or processing the semiconductor device implies the one which deteriorates the characteristic thereof when added into the semiconductor device as an impurity in a trace amount of, e.g., $1\times10^{10}$ atoms/cm$^2$; and one such example is copper. Moreover, it is preferable that the resistivity of the second metal material is lower than that of aluminum.

As described above, the surface metal layer 108 made of the second metal material is formed on the surface of the first metal material 106 forming the elastic body, thereby forming the elastic body by selecting an elastic metal material without considering the resistivity thereof. While, for the metal material of the surface metal layer 108, the metal which has a low resistivity and no bad influence on manufacturing the semiconductor device can be selected without considering elasticity, so that the electrical joint member 104 having elasticity and a lower contact resistance between the conductive members can be manufactured.

Figure 11:
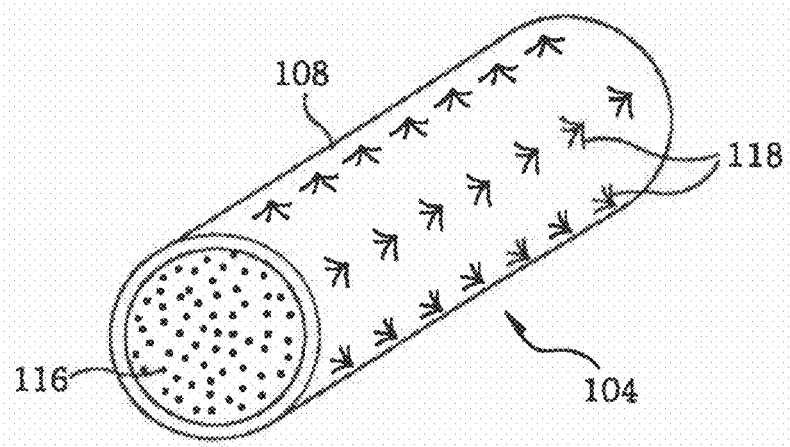
FIG. 11 is a general view showing an electrical joint member in accordance with another preferred embodiment.

In addition, the elastic body forming the electrical joint member 104 is not limited to the spiral if it is configured to have elasticity but it may be another elastic structure body. Further, it is not limited to that made up of the metal material. In the electrical joint member 104 configured as shown in FIG. 11, formed on the surface of a cylindrical elastic body 116 made of resin which is an elastic organic compound is the surface metal layer 108 made of aluminum. In this example, formed on the surface of the surface metal layer 108 is a protrusion 118 for further ensuring an electrical contact.

Figure 12:
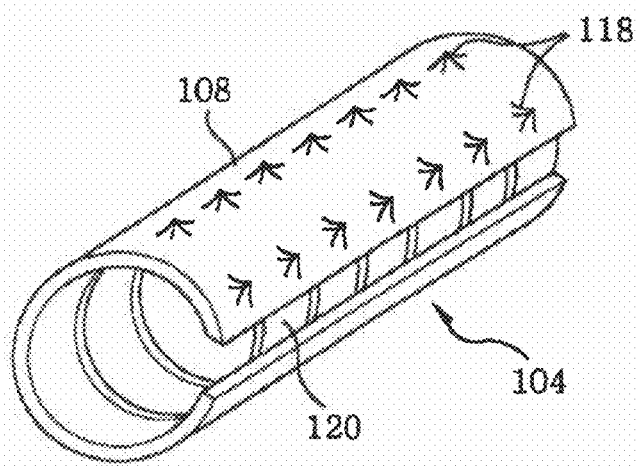
FIG. 12 is a general view showing an electrical joint member in accordance with a still another preferred embodiment.

Moreover, the surface metal layer 108 is not limited to that is coated on the whole periphery of the elastic body. For example, as shown in FIG. 12, formed on the surface of the spiral 120 made of stainless steel which is the elastic body is the surface metal layer 108 identical to that in FIG. 11, and a part of the surface of the spiral 120 may be configured to expose. However, in case the elastic body 116 or the spiral 120 includes the metal material such as copper (Cu) which has an obvious negative effect on manufacturing the semiconductor device, it is necessary to coat the whole periphery thereof. The surface metal layer 108 illustrated in FIGS. 11 and 12 may be joined to the surface of the elastic body 116 made of resin or the spiral 120 by using, e.g., an aluminum foil.

Figure 13A:
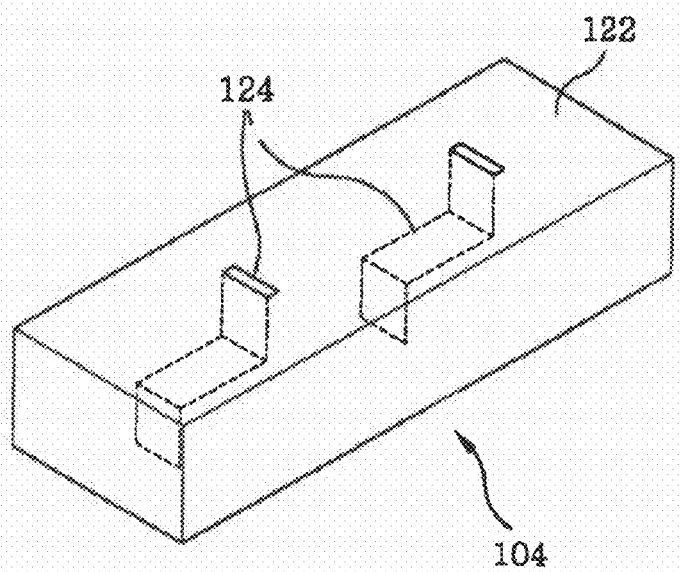
FIG. 13A is a perspective view showing an electrical joint member in accordance with still another preferred embodiment.
Figure 13B:
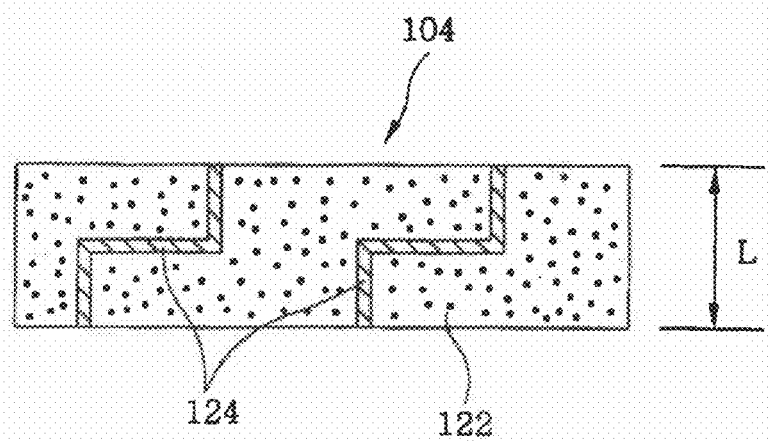
FIG. 13B is a cross sectional view illustrating an inner structure of the electrical joint member in FIG. 13A.

Furthermore, as shown in FIGS. 13A and 13B, the electrical joint member 104 may be configured that while a conductive joint member 124, which is formed to bend both end portions of a strip-shaped body made of, e.g., aluminum in a key shape in an opposite direction, is inserted into the rectangular parallelepiped shape elastic body 122 made of resin which is an organic compound, the corresponding both end portions of the conductive joint member 124 is respectively exposed from the both surfaces of an elastic body 122. This is an effective structure in that, though aluminum does not possess elasticity, when both surfaces of resin serving as the elastic body 122 are inserted between the conductive members, the conductive joint member 124 made of aluminum can have a reaction force by a restoration force of the resin and, therefore, a lower contact resistance can be obtained by a small stress. The resin can be used in a range of an elastic margin if it is compressed in an amount of, e.g., 30% of the length L of the elastic body 122. In case of using the resin to be compressed in an amount of, e.g., 20% of the length L when the corresponding electrical joint member 104 is interposed between the conductive members, the compressed amount thereof becomes 0.03 mm when the length L is 0.15 mm and the compressed amount thereof becomes 0.3 mm when the length L is 1.5 mm. In this case, the material of the conductive joint member 124 is not limited to aluminum. For example, a metal material, which has a lower resistivity than that of aluminum and has no influence on manufacturing a semiconductor device, may be used.

As described above, in accordance with the present invention, there is provided the electrical joint member produced by forming the surface metal layer made of aluminum on the surface of the elastic body. The electrical joint member is a composite material constituted by an aluminum material having a low resistivity but without resilience, and has elasticity in its entirety and a low resistivity. By disposing such an electrical joint member between the conductive members or the joint surfaces joined together in the processing apparatus, the electrical resistance between the conductive members can be effectively reduced without causing metal contamination in the processing apparatus, so that proper care can be taken on the processing apparatus and a power loss can be reduced.

EMBODIMENTS

Next, there will be described an experiment carried out in order to confirm the effect of the present invention.
(Making of an Electrical Joint Member)

A. Embodiment 1

An electrical joint member was obtained by forming the surface metal layer made of aluminum having a thickness of 100 μm on the surface of the spiral formed by using a strip-shaped body made of stainless steel having a thickness of 80 μm and a width of 2 mm. This electrical joint member is referred to as an embodiment 1.

B. Embodiment 2

An electrical joint member was obtained identically with the preferred embodiment 1 except employing a BeCu spiral instead of the spiral made of stainless steel as the elastic body. This electrical joint member is referred to as an embodiment 2.

C. Embodiment 3

Only 1 cm was cut from a ring body made of resin called an O-ring generally used as a vacuum sealing material. This was employed as the elastic body and the outer surface thereof was coated with an aluminum foil, thereby making an electrical joint member. This is referred to as an embodiment 3.

D. Comparative Example 1

An electrical joint member was obtained identically with the preferred embodiment 1 except that the surface metal layer made of aluminum is not formed. This electrical joint member is made up of the spiral made of stainless steel and this is referred to as a comparative example 1.

(Preliminary Test)

Figure 14A:
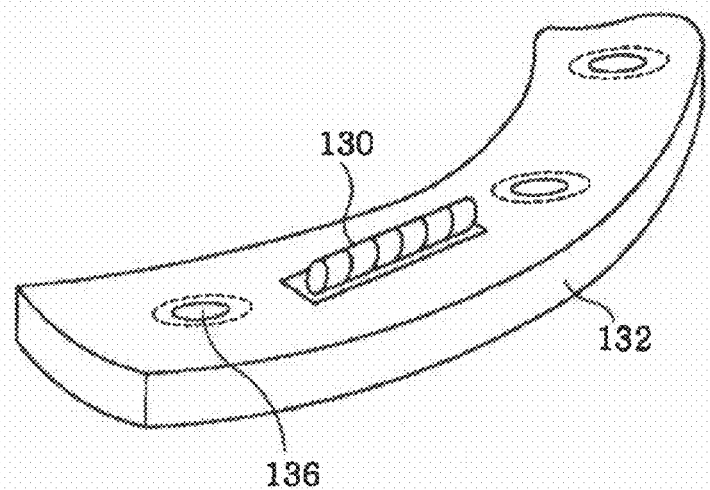
FIG. 14A is a perspective view showing a joint between conductive members by being fastened with bolts and in-plane pressures of a joint surface as an image.
Figure 14B:
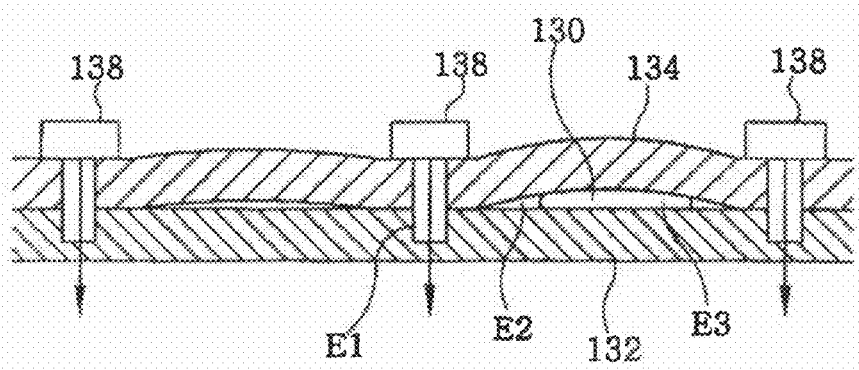
FIG. 14B shows a cross sectional view showing the joint between the conductive members by being fastened with the bolts and the existing in-plane pressure of joint surfaces as an image.

Tests were conducted to identify the degree of the in-plane pressure of various parts in case of fastening with bolts the gap between the conductive members employed in the plasma processing apparatus by using the electrical joint member. The joint structure of the conductive members and an image of the in-plane pressure are illustrated in FIGS. 14A and 14B from a motif of the joint of the deposition shield. The reference numeral 130 in FIGS. 14A and 14B is referred to an electrical joint member, and the reference numerals 132 and 134 are a conductive member at one side and another conductive member at the other side, respectively. The reference numeral 136 is a bolt hole and the reference numeral 138 is a bolt. The in-plane pressure was investigated at the bolt-fastened place E1, the place E2 positioned 30 mm apart from the bolt-fastened place and the place E3 where the electrical joint member 130 was installed. The outer diameter of the conductive member was 595 mm, and the conductive members were tightly fastened with eight bolts disposed at identical intervals in a torque of 50 kgf·cm. However, the in-plane pressure cannot be measured in an actual apparatus. Therefore, by employing aluminum plates as test pieces, the in-plane pressures corresponding to the respective places E1 to E3 were obtained as the in-plane pressures per contact surface of 10 mm by using a push pull gauge or a load cell respectively depending on the magnitude of in-plane pressure.

As an image of the in-plane pressure is shown in FIG. 14B, though the in-plane pressure in the bolt-fastened E1 is equal to or more than 50 kgf, the in-plane pressure in the neighboring E2 is equal to or less than 10 kgf. Further, since the in-plane pressure of the place E3 in which the electrical joint member 130 is installed cannot be directly measured, it is estimated to be over at least 3 kgf from the result of interposing and squashing the O-ring as the resin sealing. Moreover, the contact resistance of a DC level was measured in a state where each in-plane pressure was applied thereto to obtain that the contact resistance in the bolt-fastened E1 was 1 to 6 mΩ and that in the neighboring E2 was equal to or more than 30 mΩ. Further, the contact resistance was measured in a state where a conventional spiral made of stainless steel as the electrical joint member was interposed between the test pieces and the in-plane pressure of 3 to 9 kgf was applied thereto. As a result, the contact resistance was 37 to 49 mΩ. Accordingly, a large in-plane pressure cannot be obtained in the other places except the bolt-fastened place even in a bolt-fastened state and, therefore, a sufficiently low contact resistance cannot be obtained in case the conventional spiral made of stainless steel is employed as the electrical joint member.

(Estimation of the Contact Resistance)

The contact resistance of the DC level was measured under the condition that the respective electrical joint members were interposed between a pair of test pieces made of aluminum and the in-plane pressure (the in-plane pressure per the length of 10 mm) between the test pieces was set to be of a value by which a compressed amount was 0.6 mm, thereby obtaining the following result.

|  | in-plane pressure | contact resistance |
| --- | --- | --- |
| embodiment 1 | 3.7 kgf | 4.6 mΩ |
| embodiment 2 | 3.4 kgf | 4.3 mΩ |
| embodiment 3 | 9.6 kgf | 4.2 mΩ |
| comparative example 1 | 2.4 kgf | 41.7 mΩ |

The values of the embodiment 1 and the comparative example 1 are selected from the result values of the following experiments and the each value of the embodiments 2 and 3 is data of only one position. The in-plane pressures of the embodiments 1 and 2 are nearly identical with those of the comparative example 1 and the contact resistances of the embodiments 1 and 2 are lower by about one order of magnitude than that of the comparative example 1. In the embodiment 3, though the in-plane pressure is set to be large, the contact resistance is nearly identical with those of the embodiments 1 and 2.

Figure 15:
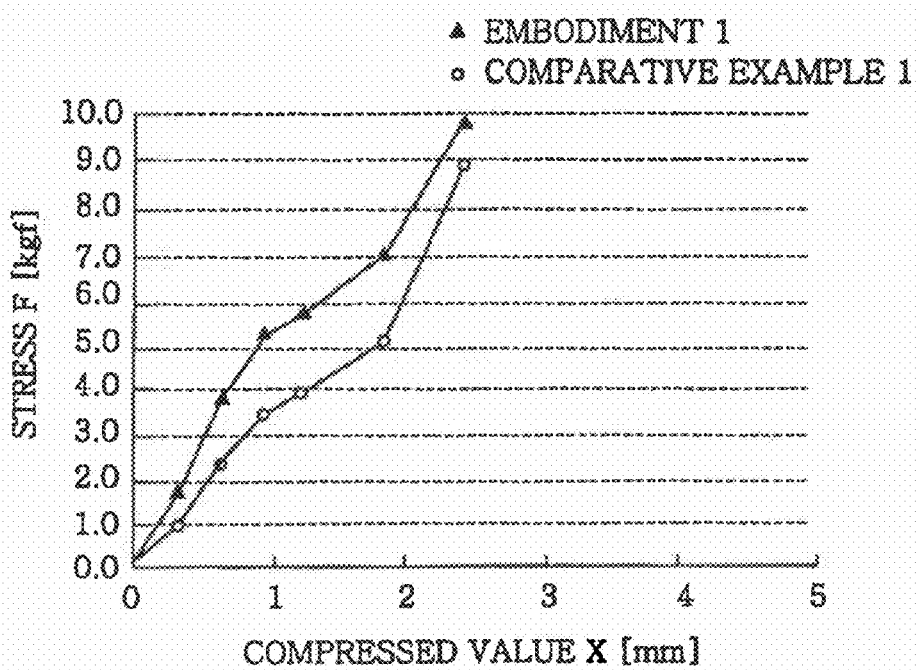
FIG. 15 describes a characteristic view showing a relationship between a compressed value and a stress in the electrical joint member of the present invention and an electrical joint member of a comparative example.
Figure 16:
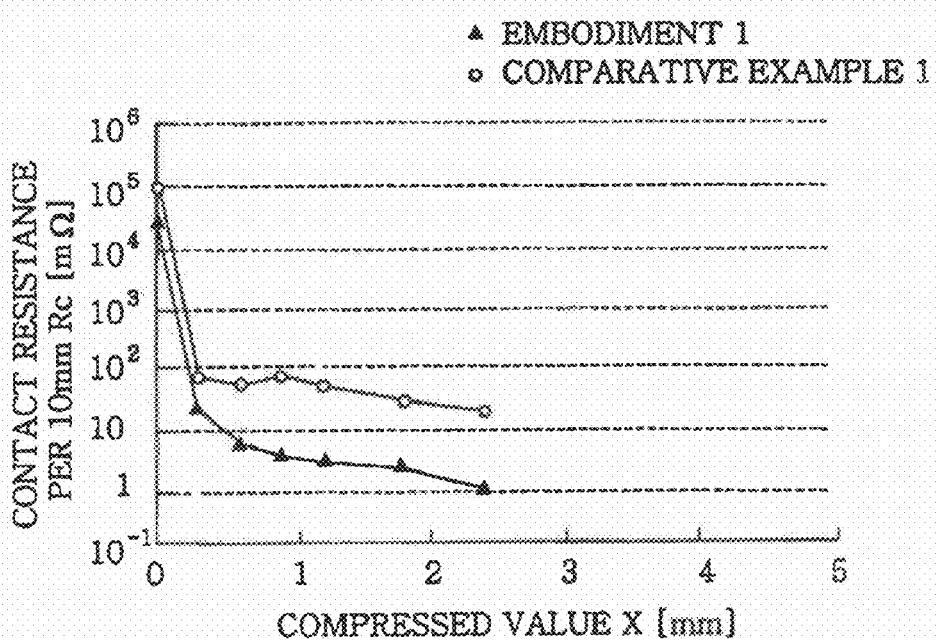
FIG. 16 illustrates a characteristic view showing a relationship between the compressed value and a contact resistance in the electrical joint member of the present invention and the electrical joint member of the comparative example.
Figure 17:
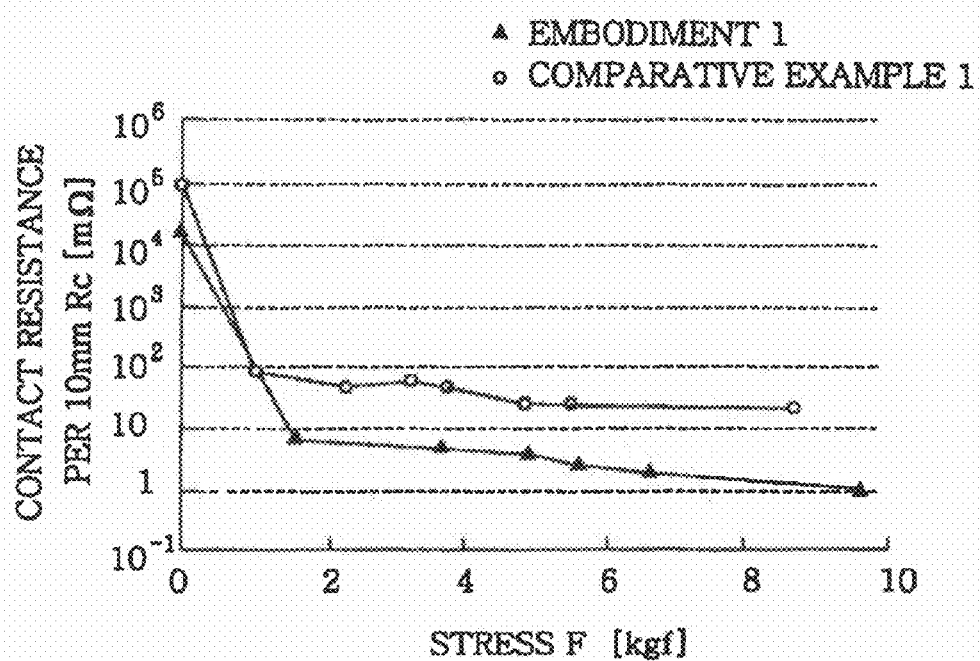
FIG. 17 provides a characteristic view showing a relationship between the stress and the contact resistance in the electrical joint member of the present invention and the electrical joint member of the comparative example.

In addition, by using a test apparatus associating a stage moving unit employing a micrometer with a push pull gauge, the stress applied to the electrical joint member, the compressed value and the contact resistance of the DC level (the contact resistance between a pair of test pieces) were investigated in case of the embodiment 1 and the comparative example 1. The result is shown in FIGS. 15 to 17. Further, the stress was calculated as the in-plane pressure per the length of contact surface of 10 mm.

As known from FIG. 15, the compressed value of the embodiment 1 is smaller than that of the comparative example 1 when the same stress is applied thereto. Further, referring to FIG. 16, the both contact resistances tend to become smaller little by little according as the both crushed values become larger when the compressed value is in the range of 0.6 to 2.4 mm. However, within the range, the contact resistance of the embodiment 1 becomes smaller by about one order of magnitude compared to that of the comparative example 1 at the same compressed value. FIG. 17 shows the result of deducing a relationship between the stress and the contact resistance from FIGS. 15 and 16. The contact resistance of the embodiment 1 becomes smaller by about one order of magnitude compared to that of the comparative example 1 at the same stress. Further, as known from FIG. 17, though the stress is made to be larger over 8 kgf, the contact resistance of the comparative example 1 is larger than that of the embodiment 1 to which the stress of about 2 kgf, is applied. Therefore, by coating a stainless spiral with aluminum, a low contact resistance can be obtained by a small stress.

(Conduction Test)

Figure 18:
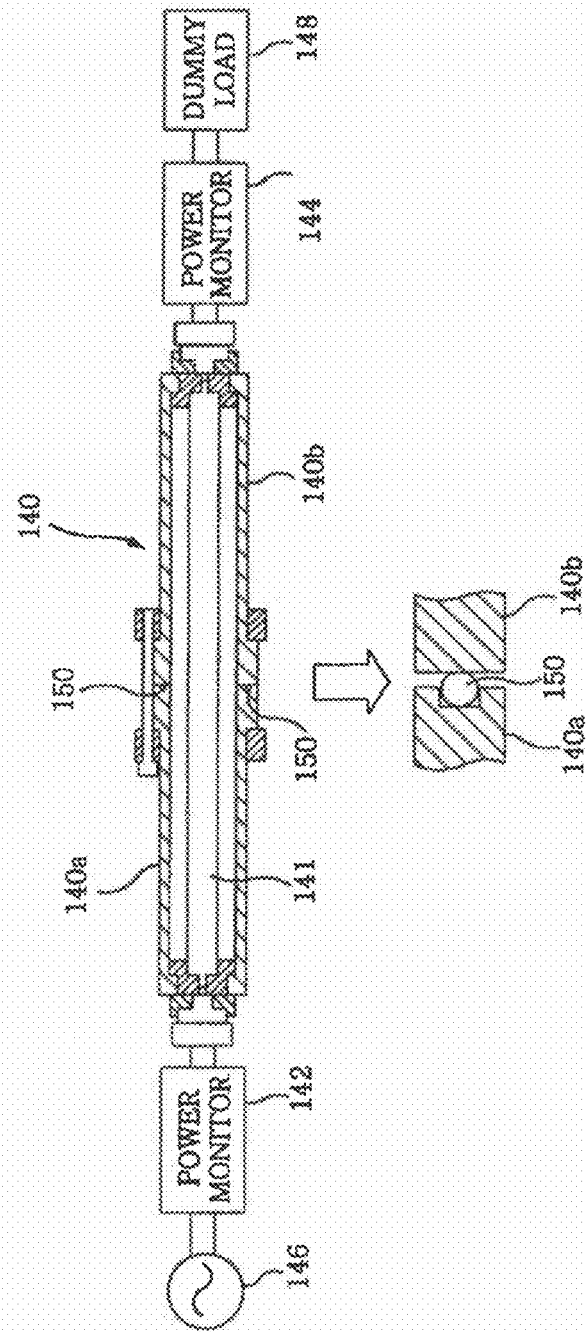
FIG. 18 offers a cross sectional view showing an experimental mechanism used for investigating a state of heat generation by a high frequency.

Tests were carried out to investigate the temperature rising degree of a high frequency conduction path when the electrical joint member was interposed in the conduction path. The contact resistance between the electrical joint member and the conductive path members against the high frequency was estimated according to the temperature rising degree thereof. FIG. 18 shows the test apparatus. The reference numeral 140 is a pipe constituting the conductive path member divided into two portions 140a and 140b in an axial direction. One end portion and the other end portion thereof are connected to a high frequency power supply 146 and a dummy load 148 through an incident power monitor 142 and an output power monitor 144, respectively. Interposed between the two divided pipe portions 140a and 140b is an electrical joint body 150 and the pipe portions 140a and 140b are electrically contacted with each other only through the electrical joint body 150. Further, the pipe 140 and a conductive bar 141 constituting the conductive path member is form a coaxial line having a characteristic impedance of 50Ω.

Figure 19:
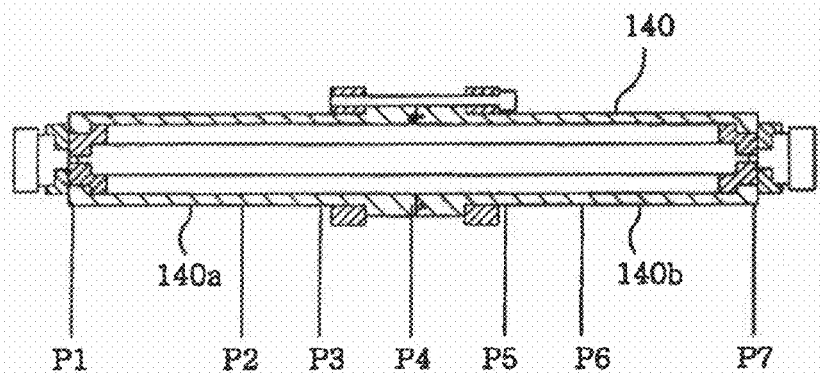
FIG. 19 is an explanatory view showing temperature-measured positions in the experimental mechanism.
Figure 20:
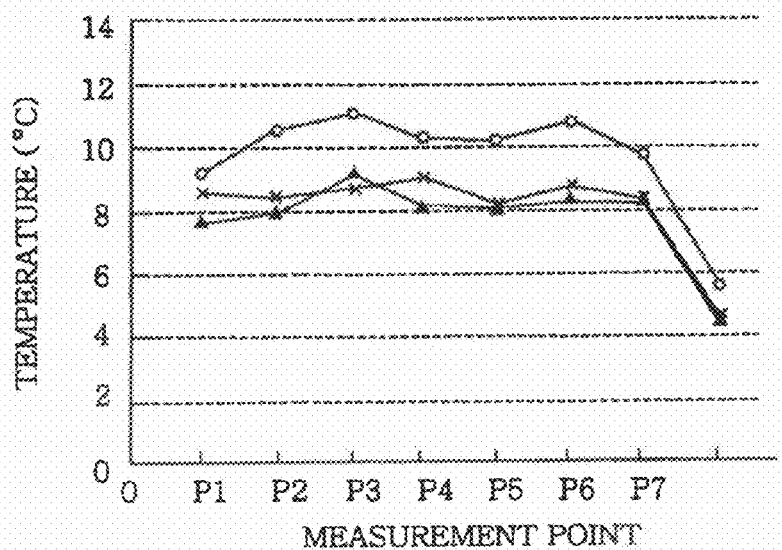
FIG. 20 is a characteristic view showing the temperatures of the regions of respective conductive paths when a high frequency is applied thereto by using the experimental mechanism.
Figure 21:
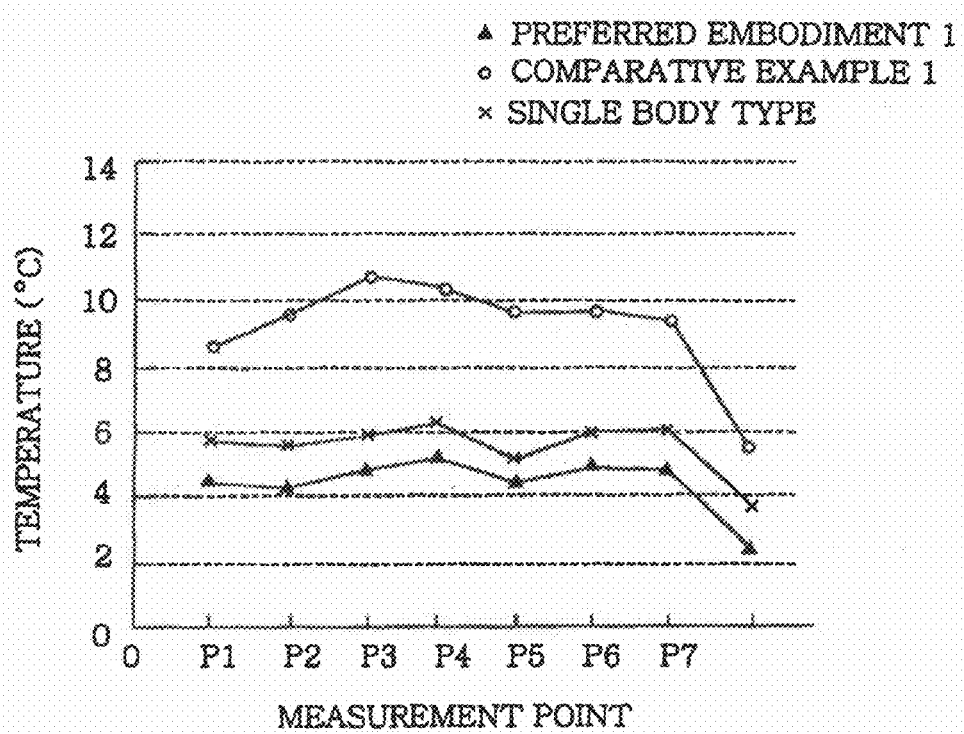
FIG. 21 is a characteristic view showing the temperatures of the regions of the respective conductive paths when a high frequency is applied thereto by using the experimental mechanism.

The surface temperature of the pipe 140 was measured by thermocouples when a high frequency was applied to conduct through the pipe 140 employing the above-described test apparatus for 80 minutes. The measurement points are as illustrated in FIG. 19. Employed electrical joint bodies 150 were prepared in accordance with the embodiment 1 and the comparative example 1. Each of the prepared electrical joint bodies 150 was 30 mm in length. The prepared electrical joint bodies 150 were disposed at two places facing each other in a diametrical direction of the pipe 140. The results for the cases where the high frequency was 100 MHz, 2 kW are shown in FIG. 20, and the results for the cases where the high frequency power was 2 MHz, 5 kW are represented in FIG. 21. The vertical axes of FIGS. 20 and 21 represent the difference value between an ambient temperature and a temperature measurement value at each position and corresponds to an amount of temperature rising due to conduction of a high frequency. Further, the results obtained when carrying out the identical tests by employing to a single body type pipe without using the electrical joint body 150 in these tests are represented as "X" in the respective drawings.

In case a high frequency power is 100 MHz and 2 kW, the temperatures of the respective positions become stable after increasing by 8 to 10° C., and the temperature when the embodiment 1 is employed is about 2° C. lower than that when the comparative example 1 is employed. Moreover, in case the high frequency power is 2 MHz and 5 kW, the temperatures of the respective positions are stable after increasing by 5 to 10° C., and the temperature when the embodiment 1 is employed is about 4° C. lower than that when the comparative example 1 is employed. Accordingly, by forming the surface metal layer made of aluminum on the stainless spiral, the loss of the high frequency can be decreased. Further, the fact that the temperature level thereof is similar to that in case of using the single body type pipe (though the temperature level in case of employing the single body type pipe becomes slightly higher than that in case of using the embodiment 1) proves that it is very effective to form the surface metal layer made of aluminum.

In addition, the plasma etching apparatus in accordance with the present invention is not limited to that of a parallel plate type. For example, it may be an apparatus generating a plasma by introducing a microwave into a chamber through an antenna or an apparatus generating a plasma by employing an electron cyclotron resonance. Further, the present invention can also be applied to another apparatuses for plasma processing such as a plasma CVD, a plasma oxidation, a plasma nitride, sputtering and so on. Moreover, the electrical joint member in accordance with the present invention can be applied to any type of processing apparatuses having a vacuum chamber, not limited to the plasma processing apparatus. The substrate to be processed in accordance with the present invention is not limited to a semiconductor wafer, but it may be various substrates for a flat panel display, a photomask, a CD substrate, a print substrate and so forth.

While the invention has been shown and described with respect to the preferred embodiments, it will be understood by those skilled in the art that various changes and modifications may be made without departing from the spirit and scope of the invention as defined in the following claims.

The invention claimed is:

1. A plasma processing apparatus comprising:
a processing vessel for providing a depressurized space for performing a plasma processing on a substrate to be processed;
a first electrode disposed in the processing vessel;
a processing gas supply unit for supplying a processing gas into the processing vessel;
a high frequency power supply for generating a high frequency voltage for forming a plasma;
a high frequency feeding conductor connected to the first electrode for supplying the high frequency voltage from the high frequency power supply to the first electrode;
a DC potential measurement unit for non-contactly measuring an electrostatic surface potential of the high frequency feeding conductor by using electrostatic capacitance to obtain the DC potential, and
a matching unit for performing an impedance matching between the high frequency power supply side and a load side, the matching unit having an input terminal electrically coupled to the high frequency power supply and an output terminal electrically coupled to the high frequency feeding conductor,
wherein the matching unit is installed outside the processing vessel, and the high frequency feeding conductor between the matching unit and the processing vessel is surrounded with a cylindrical conductor connected to a ground potential,
wherein the high frequency feeding conductor includes a joint piece detachably connecting the high frequency feeding conductor together via a connecting part,
wherein the cylindrical conductor includes a first cylindrical conductor portion whose one end is coupled to the processing vessel, a second cylindrical conductor portion whose one end is coupled to the matching unit, and a first connecting part including a pair of semi-cylindrical connecting parts for attachably and detachably connecting the other ends of the first and the second cylindrical conductor portion with each other, and
wherein a probe of the DC potential measurement unit is installed in the first connecting part in a vicinity of the joint piece.

2. The plasma processing apparatus of claim 1, comprising a second electrode disposed to face the first electrode in parallel in the processing vessel.

3. The plasma processing apparatus of claim 2, wherein the substrate to be processed is disposed on the first electrode, and vent-holes for discharging the processing gas toward the first electrode are provided in the second electrode.

4. The plasma processing apparatus of claim 1, wherein the high frequency feeding conductor includes a first bar-type conductor whose one end is fixed to a rear surface of the first electrode; a second bar-type conductor whose one end is fixed to the output terminal of the matching unit; and a second connecting part for attachably and detachably connecting the other ends of the first and the second bar-type conductor with each other; and wherein the second connecting part is disposed in a position corresponding to the first connecting part.

5. The plasma processing apparatus of claim 1, wherein the first connecting part includes a reentrant cavity in which the probe is disposed.

* * * * *